United States Patent
Kushibiki et al.

(10) Patent No.: US 8,491,804 B2
(45) Date of Patent: Jul. 23, 2013

(54) SUBSTRATE PROCESSING METHOD

(75) Inventors: Masato Kushibiki, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 351 days.

(21) Appl. No.: 12/721,962

(22) Filed: Mar. 11, 2010

(65) Prior Publication Data

US 2010/0240217 A1 Sep. 23, 2010

Related U.S. Application Data

(60) Provisional application No. 61/176,596, filed on May 8, 2009.

(30) Foreign Application Priority Data

Mar. 13, 2009 (JP) ................. 2009-061138

(51) Int. Cl.
*B44C 1/22* (2006.01)
*C03C 15/00* (2006.01)
*C03C 25/68* (2006.01)
*C23F 1/00* (2006.01)
*H01L 21/311* (2006.01)

(52) U.S. Cl.
USPC .............. 216/46; 216/41; 438/694; 438/696; 427/255.28

(58) Field of Classification Search
USPC ............... 216/41, 46, 49, 50, 58; 438/694, 438/696, 706; 427/255.28
See application file for complete search history.

(56) References Cited

U.S. PATENT DOCUMENTS

| | | | |
|---|---|---|---|
| 7,425,277 B1 * | 9/2008 | Koemtzopoulos et al. | 216/41 |
| 7,906,168 B2 * | 3/2011 | Hasebe et al. | 427/58 |
| 8,168,375 B2 * | 5/2012 | Nakajima et al. | 430/317 |
| 2006/0141766 A1 | 6/2006 | Kim | |
| 2007/0037410 A1 * | 2/2007 | Chang et al. | 438/780 |
| 2008/0032492 A1 * | 2/2008 | Baek | 438/595 |
| 2008/0081104 A1 * | 4/2008 | Hasebe et al. | 427/58 |
| 2009/0029284 A1 | 1/2009 | Matsumaru et al. | |
| 2009/0035665 A1 * | 2/2009 | Tran | 430/5 |
| 2009/0087990 A1 * | 4/2009 | Yatsuda et al. | 438/694 |
| 2009/0087991 A1 * | 4/2009 | Yatsuda et al. | 438/694 |
| 2009/0311490 A1 * | 12/2009 | Burns et al. | 428/195.1 |
| 2010/0130015 A1 * | 5/2010 | Nakajima et al. | 438/703 |

FOREIGN PATENT DOCUMENTS

| | | |
|---|---|---|
| JP | 7-321091 A | 12/1995 |
| JP | 2006-190939 | 7/2006 |
| JP | 2007-5598 | 1/2007 |
| JP | 2009-16815 A | 1/2009 |
| WO | 2008/149989 A1 | 12/2008 |
| WO | WO 2008149988 A1 * | 12/2008 |

\* cited by examiner

*Primary Examiner* — Allan Olsen
*Assistant Examiner* — Margaret D Klunk
(74) *Attorney, Agent, or Firm* — Rothwell, Figg, Ernst & Manbeck, P.C.

(57) ABSTRACT

A method of processing a substrate having a processing target layer and an organic film serving as a mask layer includes a mineralizing process of mineralizing the organic film. The mineralizing process includes an adsorption process for allowing a silicon-containing gas to be adsorbed onto a surface of the organic film; and an oxidation process for oxidizing the adsorbed silicon-containing gas to be converted into a silicon oxide film. A monovalent aminosilane is employed as the silicon-containing gas.

20 Claims, 5 Drawing Sheets

SUBSTRATE PROCESSING METHOD

CROSS-REFERENCE TO RELATED APPLICATIONS

This application claims priority to Japanese Patent Application No. 2009-061138 filed on Mar. 13, 2009, the entire contents of which are incorporated herein by reference.

FIELD OF THE INVENTION

The present invention relates to a substrate processing method; and, more particularly, to a substrate processing method of mineralizing an organic film serving as a mask layer.

BACKGROUND OF THE INVENTION

There has been disclosed a wafer for a semiconductor device where an impurity-containing oxide film, e.g., a tetra ethyl ortho silicate (TEOS) film, produced by a chemical vapor deposition (CVD) or the like; an electrically conductive film, e.g., a titanium nitride (TiN) film; a bottom anti-reflective coating (BARC) film; and a mask layer (photoresist film) are stacked in that order on a silicon substrate (see, e.g., Japanese Patent Application Publication No. 2006-190939 and corresponding US patent Application Publication No. 2006-0141766 A1). The photoresist film is processed to have a predetermined pattern by photolithography and serves as a mask layer when the BARC film and the conductive film are etched.

As the scaling down of semiconductor devices has recently been in progress, it is needed to form a finer circuit pattern on a surface of the wafer described above. In order to form such a finer circuit pattern, it is required to form a small-sized opening (a via hole or a trench) on an etching target film by reducing a minimum feature dimension of the pattern of the photoresist film in the manufacturing process of a semiconductor device.

In order to form the small-sized pattern on the photoresist film, a highly transparent material may be employed to improve a pattern transfer fidelity by an exposure light. Since, however, such a highly transparent material has a low hardness, the strength of the mask layer is deteriorated. As a result, it becomes difficult to obtain a satisfactory etching resistance.

As such, a formation of a finer pattern and an etching resistance of a material are in a trade-off (antinomy) relationship in the mask layer.

There has been disclosed a technique for improving the etching resistance of a mask layer in the manufacturing process of a semiconductor device (see, e.g., Japanese Patent Application Publication No. 2007-005598 and corresponding US patent Application Publication No. 2009-0029284 A1)

In this Japanese Patent Application Publication, a technique for forming a mask has been disclosed. Specifically, a mask layer is coated with a pattern coating material containing a metal compound capable of producing a hydroxyl group by hydrolysis, the pattern coating material being employed in an etching process of etching a base layer by using patterns formed on a substrate as the mask layer. Then, by bringing water or deionized water into contact with the pattern coating material, the metal compound is hydrolyzed thereby producing the hydroxyl group. As a result, an etching-resistant mask including the metal oxide is formed.

Since, however, the strength of the mask layer formed by such a conventional method is not satisfactory, it is needed to develop a satisfactory etching-resistant mask layer formed with a fine pattern.

SUMMARY OF THE INVENTION

In view of the above, the present invention provides a substrate processing method capable of improving freedom of processing of a processing target layer by increasing etching resistance of a mask layer when forming in a processing target layer an opening having a size that meets a demand for the scaling-down of semiconductor device.

In accordance with an embodiment of the present invention, there is provided a method of processing a substrate including a processing target layer and an organic film serving as a mask layer. The method includes a mineralizing process of mineralizing the organic film.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

A substrate processing apparatus in which a substrate processing method in accordance with an embodiment of the present invention is carried out will be described first. The substrate processing apparatus is an apparatus (referred to as "mineralizing apparatus") configured to perform a molecular layer deposition (MLD) for mineralizing an organic film of a semiconductor wafer W serving as a substrate. Here, when a plasma is generated, a power can be increased to, e.g., approximately 500 W to 3,000 W.

Figure 1:
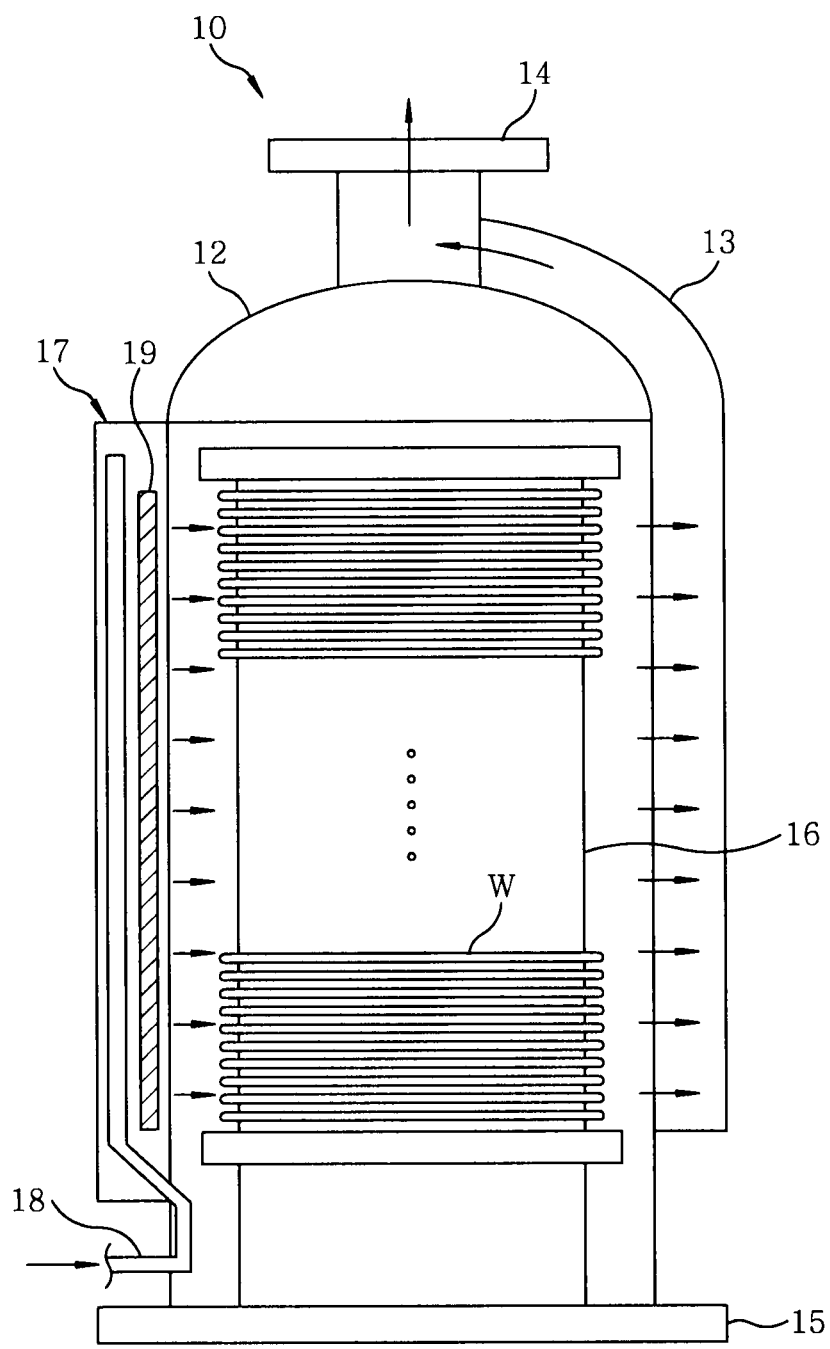
FIG. 1 is a cross sectional view schematically showing a structure of a mineralizing apparatus in which a substrate processing method in accordance with an embodiment of the present invention is carried out.

FIG. 1 is a cross sectional view schematically showing a structure of a mineralizing apparatus 10 in which a substrate processing method in accordance with an embodiment of the present invention is carried out. The mineralizing apparatus 10 is a batch type. Alternatively, it can be a single-sheet type.

As shown in FIG. 1, the mineralizing apparatus 10 is provided with a bell jar type reaction tube 12 having a substantially cylindrical shape with a ceiling. The reaction tube 12 is made of a high heat-resistant and corrosion-resistant material, e.g., quartz.

Provided on a portion of an outer surface of the reaction tube 12 is an exhaust path 13 through which a gas inside the reaction tube 12 is exhausted. The exhaust path 13 upwardly extends along the reaction tube 12 to communicate with the inside of the reaction tube 12 via a plurality of openings. A top portion of the exhaust path 13 is connected to an exhaust port 14 provided at a top portion of the reaction tube 12. A pressure control mechanism (not shown) is provided at the exhaust port 14 and the pressure inside the reaction tube 12 is controlled to a preset vacuum level by the pressure control mechanism.

A lid 15 made of, e.g., quartz is arranged at the bottom of the reaction tube 12. The lid 15 is vertically movable by an elevator unit. Specifically, when the lid 15 is upwardly moved, a bottom side (fire hole portion) of the reaction tube 12 is closed. When the lid 15 is downwardly moved, the bottom side of the reaction tube 12 is opened.

A wafer boat 16 made of, e.g., quartz is mounted on the lid 15, and a plurality of horizontally disposed wafers W serving as target substrates are accommodated in a vertical direction at a predetermined interval therebetween in the wafer boat 16. A heater (not shown) is arranged around the reaction tube 12 to control the temperature therein.

Provided to the reaction tube 12 are an oxidizing gas supply line 18 for introducing an oxidizing gas and a processing gas supply line (not shown) for introducing a processing gas other than the oxidizing gas. The oxidizing gas supply line 18 is connected to the reaction tube 12 via a plasma generation unit 17. Accordingly, the oxidizing gas flows through the oxidizing gas supply line 18 and, then, is converted to active oxygen (referred to as "oxygen radicals") by being plasma-excited by a pair of electrodes 19 provided in the plasma generation unit 17. Thereafter, the oxygen radicals are introduced into the reaction tube 12.

The processing gas supply line is arranged in parallel with the oxidizing gas supply line 18 and is directly connected to the reaction tube 12. A dispersion injector, for example, is employed as the processing gas supply line. The processing gases supplied to the reaction tube 12 may include, e.g., a source gas, an oxidizing gas, a dilution gas, a purge gas, and the like. A processing gas other than the oxidizing gas, i.e., the source gas, the dilution gas, the purge gas or the like is introduced into the reaction tube 12 through the processing gas supply line.

The source gas allows silicon serving as a source to be adsorbed onto a surface of an organic film formed on a wafer W. A silicon-containing gas, a monovalent aminosilane, e.g., $SiH_3(NHC(CH_3)_3)$ or $SiH_3(N(CH_3)_2)$, can be adequately employed as the source gas. The oxidizing gas oxidizes the source (silicon) adsorbed onto the organic film, and an oxygen-containing gas is employed as the oxidizing gas. As the oxygen-containing gas, pure $O_2$ gas may be employed for example. Alternatively, a gas in which the $O_2$ gas is adequately diluted with $N_2$ gas or the like may be employed as the oxygen-containing gas.

The dilution gas serves to dilute other processing gas. For example, $N_2$ gas may be employed. Moreover, a nonreactive gas, e.g., $N_2$ gas, may be employed as the purge gas. Other gases than the oxidizing gas are not plasma-excited (activated). A plurality of supply holes (not shown) is vertically arranged at a preset interval therebetween in each of the oxidizing gas supply line 18 and the processing gas supply line. The processing gas is supplied to the reaction tube 12 through the supply holes.

The mineralizing apparatus 10 includes a controller (not shown) for controlling various components thereof and various sensors installed as necessary.

Hereinafter, a mineralizing process of a substrate processing method in accordance with the embodiment of the present invention performed in the mineralizing apparatus 10 will be described in detail.

The mineralizing process is performed by mineralizing an organic film, e.g., a photoresist film having a fine pattern on the wafer W, by MLD, to thereby increase the etching resistance. As a result, process freedom of a processing target layer is improved.

The mineralizing process of an organic film is performed by the controller of the mineralizing apparatus 10 according to a mineralizing process program for performing the mineralizing process directly on a photoresist film or, e.g., a photoresist film whose line portions constituting an opening pattern have been trimmed to have a reduce width by an etching process performed by, e.g., a parallel plate type substrate processing apparatus.

Figure 2:
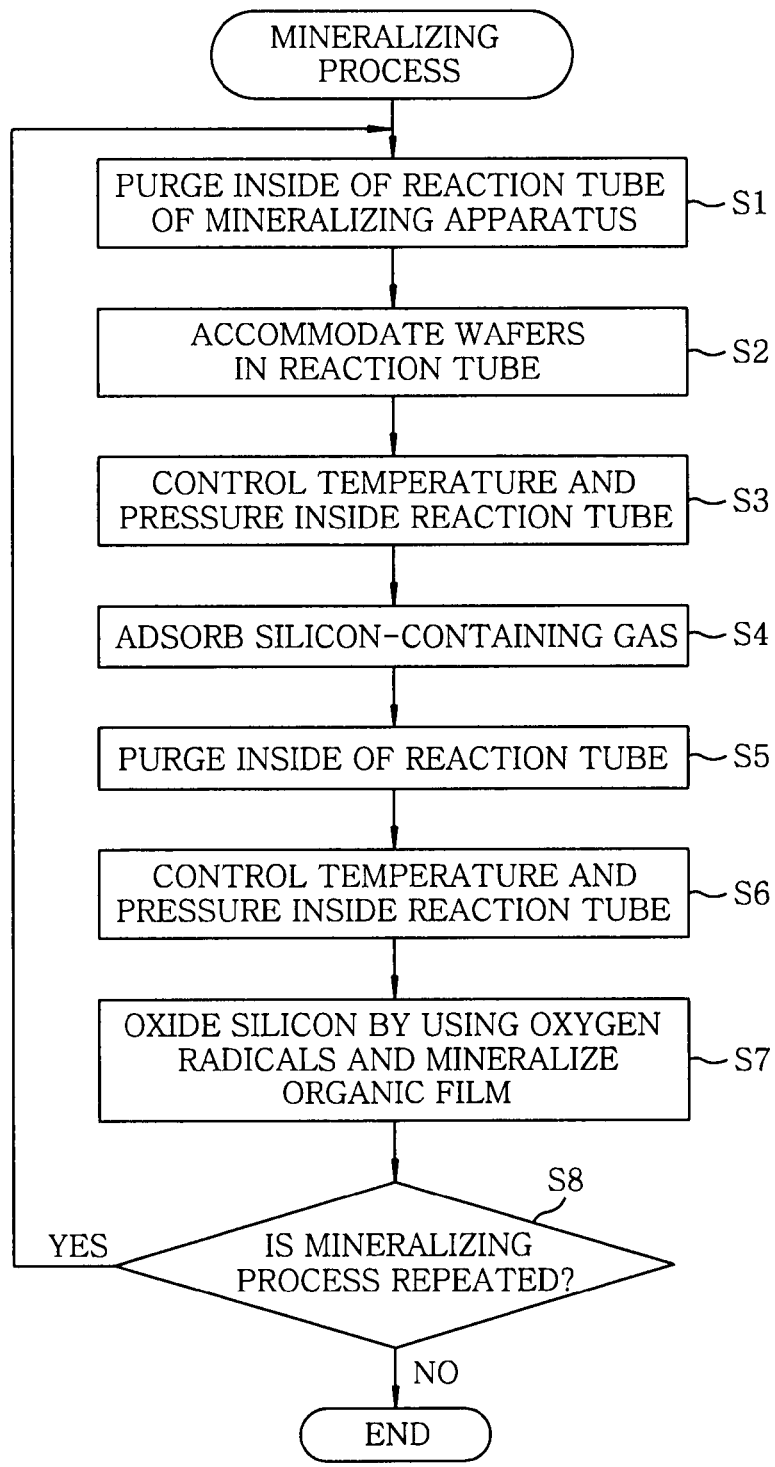
FIG. 2 is a flow chart showing a mineralizing process of an organic film in the substrate processing method in accordance with the embodiment of the present invention.

FIG. 2 is a flow chart showing a mineralizing process of an organic film of the substrate processing method in accordance with the embodiment of the present invention.

As shown in FIG. 2, to carry out the mineralizing process, the inside of the reaction tube 12 is first purged by directly introducing $N_2$ gas from the processing gas supply unit into the reaction tube 12 of the mineralizing apparatus 10 shown in FIG. 1 (step S1). Thereafter, the wafer boat 16 accommodating a plurality of wafers W thereon is mounted on the lid 15 and, then, the wafers W are accommodated in the reaction tube 12 by upwardly moving the lid 15 (step S2).

Then, a temperature and a pressure inside the reaction tube 12 are controlled to preset levels, e.g., approximately 400° C. and $6.65 \times 10$ Pa (500 mTorr), respectively, (step S3) and, then, in this state, the silicon-containing gas, e.g., monovalent aminosilane $SiH_3(NHC(CH_3)_3)$ is introduced thereto through the processing gas supply line and is adsorbed onto a surface of a photoresist film of each of the wafers W (step S4) (adsorption process). After the silicon-containing gas is adsorbed onto the surface of the photoresist film, the residual silicon-containing gas or the like inside the reaction tube 12 is purged by introducing the $N_2$ gas thereto through the processing gas supply line (step S5).

Successively, the temperature inside the reaction tube 12 where the excess silicon-containing gas or the like has been purged is set to, e.g., approximately 400° C. and the pressure therein is controlled to, e.g., approximately $6.65 \times 10$ Pa (500 mTorr) (step S6) by supplying the $N_2$ gas, for example. Then, e.g., $O_2$ gas is supplied into the reaction tube 12 through the oxidizing gas supply line 18; and a high frequency power of, e.g., 500 W to 3000 W is applied between the electrodes 19 of the plasma generation unit 17, thereby plasma-exciting oxygen to generate oxygen radicals, which are then are supplied to the reaction tube 12. Thus, the silicon-containing gas adsorbed onto the photoresist film is oxidized into a silicon oxide film. (step S7) (Oxidation process).

In step S7, C and H components of the silicon-containing gas are vaporized and removed as, e.g., $CO_2$ and $H_2O$, respectively, and Si is converted to, e.g., $SiO_2$. Moreover, C component of the photoresist film is vaporized as $CO_2$ and, thus, the width of the line portion thereof constituting the opening pattern is reduced. After the silicon oxide film is formed on a surface of the photoresist film in step S7, the supply of the oxygen-containing gas is stopped and the inside of the reaction tube 12 is purged by introducing the $N_2$ gas thereinto through the processing gas supply line to thereby complete one cycle of the mineralizing process.

Then, it is determined whether the cycle of the mineralizing process needs to be repeated (step S8) and the steps S1 to S7 are repeatedly carried out as required until the whole mineralizing process is completed. If it is determined that the cycle of the mineralizing process needs not to be repeated any more, the mineralizing process is completed.

By the mineralizing process shown in FIG. 2, the silicon-containing gas is adsorbed onto the surface of the photoresist film of the wafer W (adsorption process), and the oxygen radicals are generated by plasma-exciting the oxygen. Then, by using the generated oxygen radicals, the adsorbed silicon-containing gas is oxidized to be converted into the silicon oxide film (oxidation process). Accordingly, the strength of the photoresist film (mask layer) of the wafer W is increased, thereby improving the process freedom of the processing target layer.

In the present embodiment, the photoresist film on which the mineralizing process is performed is an organic film having a line width, e.g., approximately 60 nm or less, of a line portion constituting the opening pattern. An organic film having a line width that is beyond approximately 100 nm is not practical due to the decrease of the mineralization rate.

In accordance with the mineralizing process of the present embodiment, the silicon-containing gas is adsorbed onto the photoresist film of a wafer W in the adsorption process and, then, the adsorbed silicon-containing gas is converted into the silicon oxide film in the oxidation process. Especially, as the silicon-containing gas is converted into the silicon oxide film, the silicon oxide film becomes thicker and the line width of the line portion constituting the opening pattern of the photoresist film becomes thinner.

In such a mineralizing process, the silicon-containing gas is uniformly adsorbed onto the surface of the photoresist film in the adsorption process of the silicon-containing gas. Accordingly, by oxidizing the uniformly adsorbed silicon-containing gas, it is possible to form on the surface of the photoresist film a homogeneous silicon oxide film having an even thickness.

In the present embodiment, the processing cycle of the steps S1 to S7 is typically repeated in several tens to several hundreds times. As for a point of time when the mineralizing process is completed, the number of repetitions of the cycles may be determined by empirically considering how many times the cycle is required to be repeated to obtain a desired mask layer and, then, when the cycle need not be repeated any more, the mineralizing process may be completed.

In this case, it is not necessary to completely mineralize the photoresist film, and the mineralizing process may be completed when the photoresist film slightly remains in the silicon oxide film. This is because it is possible to obtain a practically adequate strength by coating the surface of the photoresist film with the silicon oxide film.

In accordance with the present embodiment, when the line width of a line portion constituting an opening pattern on a mask layer becomes too wide in the photoresist film that has been subjected to the mineralization process, the line width may get thinner by performing an additional etching process with a well-known oxide film etching method.

In accordance with the present embodiment, the temperature inside the reaction tube 12 is preferably in the range from approximately 20° C. to 700° C. If the temperature inside the reaction tube 12 is lower than approximately 20° C., the silicon-containing gas may be insufficiently adsorbed onto the photoresist film in the adsorption process. If the temperature therein is higher than approximately 700° C., a film quality or a film thickness of the silicon oxide film may become nonuniform after the oxidation process.

However, if the temperature inside the reaction tube 12 in the adsorption process is in the range from approximately 20° C. to 700° C., the silicon-containing gas can be properly adsorbed onto the photoresist film and, thus, it is possible to form a homogeneous silicon oxide film having an even thickness.

In accordance with the present embodiment, the pressure inside the reaction tube 12 is preferably in the range from approximately $1.33 \times 10^{-1}$ Pa (1 mTorr) to $1.33 \times 10$ kPa (100 Torr). In this range of pressure, it is possible to make adequate the adsorption state of the silicon-containing gas onto the photoresist film.

In the present embodiment, the supply amount of the oxygen-containing gas can vary depending on an oxygen concentration in the oxygen-containing gas, a plasma excitation state or the like. However, it is preferable to supply the oxygen-containing gas that can convert into the silicon oxide film the silicon-containing gas adsorbed onto the photoresist film.

In the present embodiment, the power supplied from the plasma generation unit 17 is preferably in the range from, e.g., approximately 500 W to 3000 W. The pressure of the plasma generation unit 17 is preferably in the range from approximately $1.33 \times 10^{-1}$ Pa (1 mTorr) to $1.33 \times 10^{2}$ Pa (1000 mTorr). In these ranges of power and pressure, it is possible to properly generate a plasma and properly supply oxygen radicals to the reaction tube 12.

In the present embodiment, the pressure inside the reaction tube 12 is preferably in the range from approximately $1.33 \times 10^{-1}$ Pa (1 mTorr) to $1.33 \times 10$ kPa (100 Torr). In this range of pressure, it is possible to adequately convert into the silicon oxide film the silicon-containing gas adsorbed onto the surface of the photoresist film.

In the present embodiment, the temperature inside the reaction tube 12 is preferably in the range from approximately 20° C. to 700° C. In this range of temperature, it is possible to satisfactorily convert into the silicon oxide film the silicon-containing gas adsorbed onto the surface of the photoresist film and easily control such a conversion.

In the present embodiment, the monovalent aminosilane is employed as the silicon-containing gas. Alternatively, divalent or trivalent aminosilane may be employed instead. For example, bistertialbutyl-aminosilane (BTBAS: $SiH_2(NHC(CH_3)_3)_2$) and tridimethyl-aminosilane (3 DMAS: $SiH(N(CH_3)_2)_3$) may be employed as the divalent and the trivalent aminosilane, respectively.

Next, the embodiment of the present embodiment will be described in detail.

In accordance with the present embodiment, a line width of a line portion a photoresist film of the wafer W constituting an opening pattern is reduced by using a parallel plate type substrate processing apparatus in order to meet the recent demand for the scaling-down of semiconductor device. Thereafter, by performing the mineralizing process on the photoresist film, the strength of the photoresist film is improved.

Figure 3:
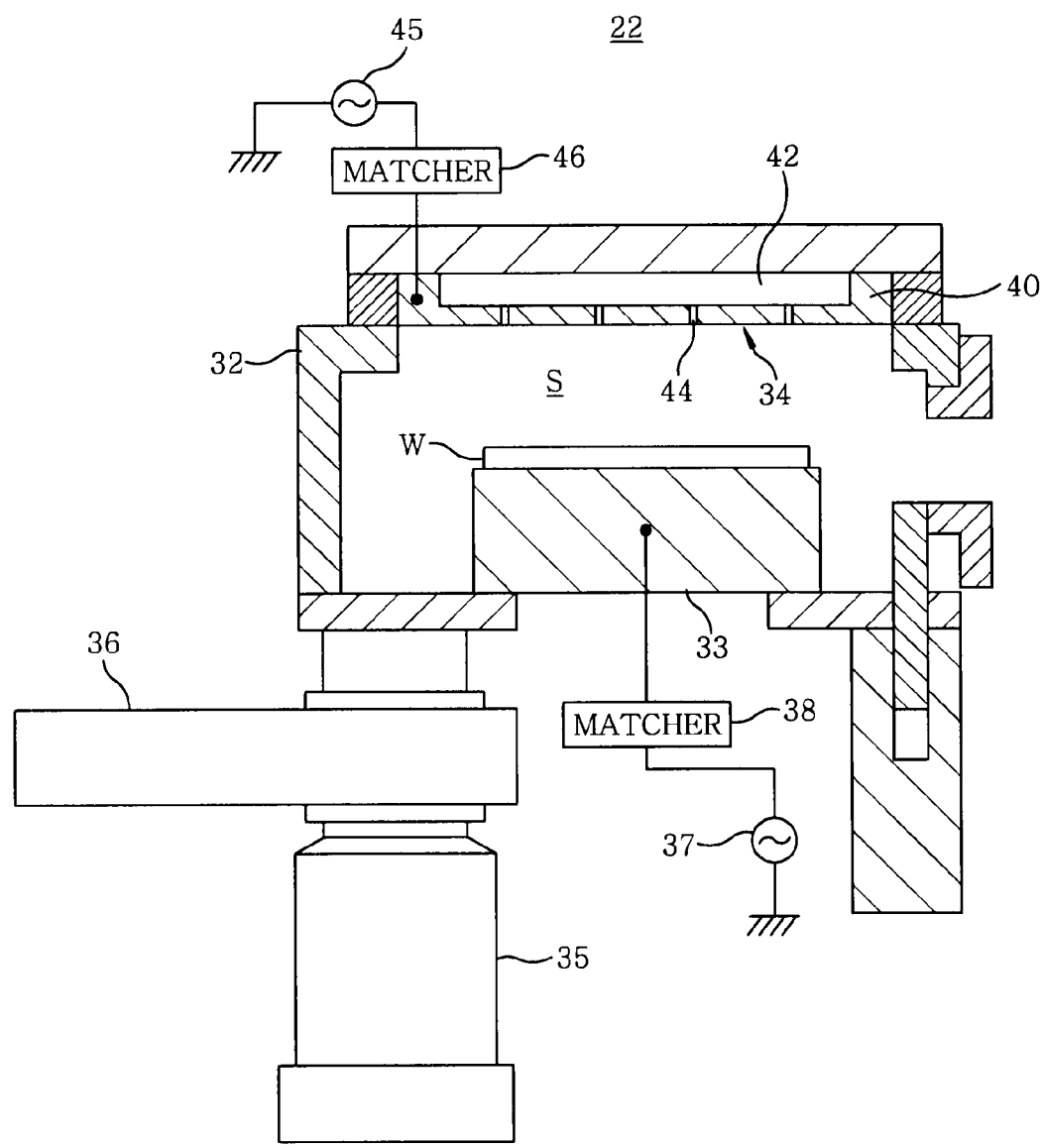
FIG. 3 is a schematic sectional view showing a process module having an upper and a lower dual frequency power supplies of a parallel plate type substrate processing apparatus that performs an etching process on a wafer.

FIG. 3 is a schematic sectional view showing a process module 22 of a parallel plate type substrate processing apparatus that performs an etching treatment on a wafer.

As shown in FIG. 3, the process module 22 includes a processing vessel (chamber) 32; a mounting table 33 arranged in the processing chamber 32 to mount a wafer W thereon; a shower head 34 arranged at an upper side of the processing chamber 32 to face the mounting table 33; a turbo molecular pump (TMP) 35 arranged to exhaust a gas and the like inside the processing chamber 32; and an adaptive pressure control (APC) valve 36 serving as a variable butterfly valve arranged between the processing chamber 32 and the TMP 35 to control a pressure inside the processing chamber 32.

A high frequency power supply 37 is connected to the mounting table 33 via a matcher 38 to supply a high frequency power thereto. Accordingly, the mounting table 33 serves as a lower electrode. Through the matcher 38, the return of the high frequency power from the mounting table 33 is suppressed, to thereby maximize the supply efficiency of the high frequency power to mounting table 33. The high frequency power is supplied from the high frequency power supply 37 to a processing space S through the mounting table 33.

The shower head 34 includes a circular plate-shaped gas supply unit 40, and the gas supply unit 40 includes a buffer chamber 42. The buffer chamber 42 communicates with an inside of the processing chamber 32 via gas injection holes 44.

The buffer chamber 42 is connected to a $CF_4$ gas supply system (not shown) and an $O_2$ gas supply system (not shown), for example. $CF_4$ gas and $O_2$ gas are respectively supplied from the $CF_4$ and the $O_2$ gas supply system to the processing chamber 32 through the gas injection holes 44.

A high frequency power supply 45 is connected to the shower head 34 via a matcher 46 to supply a high frequency power thereto. Accordingly, the shower head 34 serves as an upper electrode. The matcher 46 has the same function as the matcher 38. The high frequency power is supplied from the high frequency power supply 45 to the processing space S through the shower head 34.

In the processing chamber 32 of the process module 22, the processing gas supplied from the shower head 34 to the processing space S is converted to a high-density plasma by supplying the high frequency powers to the processing space S through the mounting table 33 and the shower head 34 as described above, to thereby generate ions and radicals. Then, an etching process which will be described later is performed.

Figure 4:
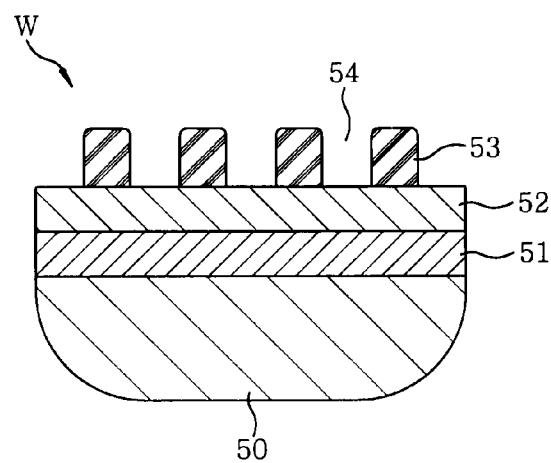
FIG. 4 is a schematic cross sectional view showing a structure of a wafer serving as a processing target substrate in accordance with the embodiment of the present invention.

FIG. 4 is a schematic cross sectional view showing a structure of a wafer serving as a target substrate in accordance with the embodiment of the present invention.

As shown in FIG. 4, the wafer W includes an amorphous carbon film 51 serving as a processing target layer formed on a surface of a silicon substrate 50; a bottom anti-reflective coating (BARC) film 52 formed on the amorphous carbon film 51; and a photoresist film (mask layer) 53 formed on the BARC film 52. In the photoresist film 53, predetermined openings 54 are provided.

The silicon substrate 50 is a circular thin plate made of silicon, and the amorphous carbon film 51 is formed on the surface of the silicon substrate 50 by performing a chemical vapor deposition (CVD), for example. The BARC film 52 is formed on the amorphous carbon film 51 by a coating process, for example.

The BARC film 52 is made of a polymer resin having a pigment absorbing an ArF excimer laser beam irradiated to the photoresist film 53. Accordingly, by the BARC film 52, the ArF excimer laser beam traveling through the photoresist film 53 is prevented from returning to the photoresist film 53 by being reflected by the amorphous carbon film 51.

The photoresist film 53 is formed on the BARC film 52 by using a spin coater (not shown), for example. The photoresist film 53 is made of a positive photosensitive resin. Therefore, if an ArF excimer laser beam is irradiated to the photoresist film 53, the photoresist film 53 becomes alkali-soluble.

An ArF excimer laser beam having a specific pattern is irradiated by a stepper (not shown) to the photoresist film 53 on the wafer W and portions of the photoresist film 53 to which the ArF excimer is irradiated become alkali-soluble.

Thereafter, a strong alkaline developing solution is dropped onto the photoresist film 53 to remove the alkali-soluble portions. Accordingly, the portions of the photoresist film exposed to the laser beam are removed, leaving the photoresist film 53 on the wafer W having the specific pattern, e.g., the openings 54 at which via holes are to be formed.

FIGS. 5A to 5H show the substrate processing method in accordance with the embodiment of the present invention.

Figure 5A:
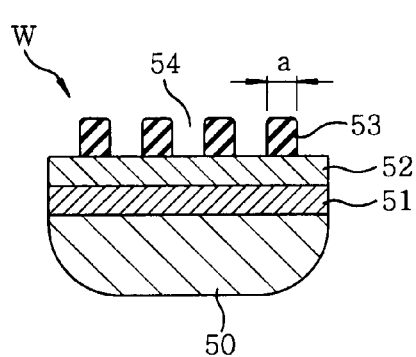
FIGS. 5A to 5H show the substrate processing method in accordance with the embodiment of the present invention.

As shown in FIGS. 5A to 5H, the wafer W is prepared first, wherein the amorphous carbon film 51 serving as a processing target layer; the BARC film 52; and the photoresist film 53 serving as a mask layer are stacked in that order on the silicon substrate 50 (FIG. 5A). The amorphous carbon film 51 has a thickness of, e.g., about 100 nm. The BARC film 52 has a thickness of, e.g., about 80 nm. The photoresist film 53 has a thickness of, e.g., about 90 nm. A specific pattern is formed on the photoresist film 53 and a line width "a" of a line portion constituting the pattern thereon has, e.g., about 60 nm. The wafer W is loaded into the processing chamber 32 of the process module 22 shown in FIG. 3 and mounted on the mounting table 33.

Thereafter, the pressure inside the processing chamber 32 is set to, e.g., about 2.6 pa (20 mTorr) and the temperature of the wafer W is set to, e.g., about 10° C. Then, from the gas supply unit 40 of the shower head 34 into the processing chamber 32, $CF_4$ gas is supplied at a flow rate of, e.g., about 100 sccm and $O_2$ gas is supplied at a flow rate of, e.g., about 10 sccm.

Figure 5B:
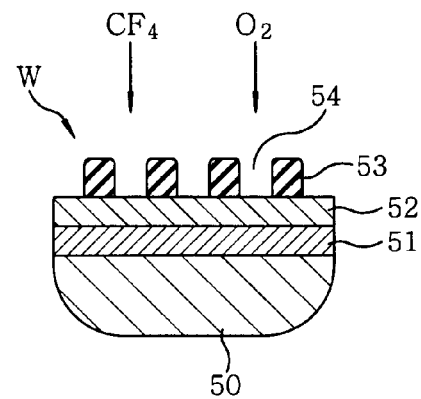

Then, a high frequency power of about 100 W is supplied to the mounting table 33, and a high frequency power of about 200 W is supplied to the shower head 34. At this time, the $CF_4$ gas and the $O_2$ gas are excited by the high frequency powers supplied to the processing space S to be converted to a plasma. As a result, ions and radicals are generated (FIG. 5B).

The ion and radicals thus generated collide and are reacted with portions of the BARC film 52 that are not covered by the photoresist film 53. Accordingly, the reacted portions are etched. The photoresist film 53 is also slightly etched, so that the line width "a" of the line portion of the photoresist film 53 gets thinner. If thinning the line width "a" is not sufficient, the same etching process is repeated by using the same processing gases.

Then, the wafer W where the line width "a" of the line portion of the photoresist film 53 has got thinner is unloaded from the processing chamber 32 of the process module 22. Then, the unloaded wafer W is loaded into a processing chamber 32 of an adjacent process module having the same configuration and mounted on a mounting table 33 thereof.

Figure 5C:
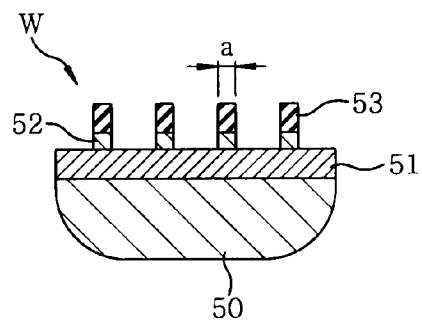

Thereafter, a pressure inside the processing chamber 32 is set to about $1.33 \times 10$ Pa (100 mTorr), and the $O_2$ gas is supplied at a flow rate of, e.g., about 300 sccm from the gas supply unit 40 of the shower head 34. Then, a high frequency power of 0 W (i.e., no high frequency power) is supplied to the mounting table 33, and a high frequency power of about 600 W is supplied to the shower head 34. Therefore, the $O_2$ gas is excited by the high frequency power supplied to the processing space S to be converted to a plasma. As a result, ions and/or radicals are generated. By the ions and radicals thus generated, the photoresist film 53 and the BARC film 52 are trimmed. By the trimming, the line width "a" of the pattern of the photoresist film 53 becomes about 30 nm (FIG. 5C).

Next, the wafer W where the line width "a" of the line portion has been trimmed to about 30 nm is accommodated into the reaction tube 12 of the mineralizing apparatus 10 shown in FIG. 1, and a temperature and a pressure inside the reaction tube 12 are controlled to, e.g., about 400° C. and $6.65 \times 10$ Pa (500 mTorr), respectively. Then, the silicon-containing gas, e.g., the $SiH_3(NHC(CH_3)_3)$ gas, is introduced and adsorbed onto a surface of the photoresist film 53.

Figure 5D:
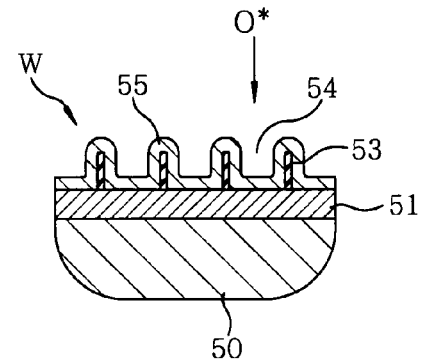

Thereafter, the oxygen-containing gas, e.g., the $O_2$ gas, is supplied and plasma-excited to generate oxygen radicals, and the $SiH_3(NHC(CH_3)_3)$ gas adsorbed onto the photoresist film 53 is oxidized by the generated oxygen radicals to be converted into the silicon oxide film 55. As a result, the photoresist film 53 is mineralized to form the silicon oxide film 55 on the surface thereof (FIG. 5D). The BARC film 52 is omitted from FIG. 5D and FIG. 5E-5G for ease of illustration.

After the photoresist film 53 is mineralized, the wafer W is loaded into a processing chamber of a process module of a parallel plate type substrate processing apparatus (not shown) in which dual frequency powers are applied to a lower electrode, the parallel plate substrate processing apparatus having a configuration different from that of the apparatus shown in FIG. 3, and mounted on a mounting table.

Next, the pressure inside the processing chamber is set to, e.g., about $1.20 \times 10$ Pa (90 mTorr), and the temperature of the wafer W is set to, e.g., about 30° C. Then, from a gas supply unit of the shower head into the processing chamber, $CF_4$ gas is supplied at a flow rate of, e.g., about 150 sccm and $O_2$ gas is supplied at a flow rate of, e.g., about 50 sccm.

Figure 5E:
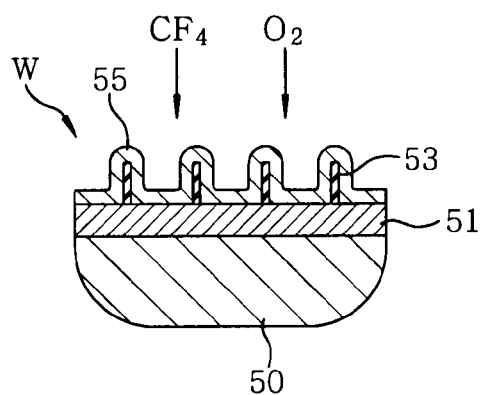

Then, an exciting power of about 300 W and a bias power of about 250 W are supplied to the mounting table. Then, the $CF_4$ gas and the $O_2$ gas are excited by the high frequency power supplied to a processing space to be converted to a plasma. As a result, ions and radicals are generated (FIG. 5E).

Figure 5F:
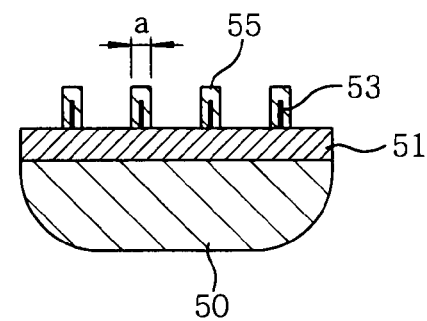

The ions and radicals thus generated collide with the silicon oxide film 55 formed on the photoresist film 53 to etch the silicon oxide film 55 (FIG. 5F). As a result, the line width "a" of the line portion constituting the pattern is reduced.

Next, the wafer W where the silicon oxide film 55 has been etched is unloaded from the processing chamber and loaded into the processing chamber of an adjacent process module (not shown) having the configuration in which dual frequency powers are applied to the lower electrode to be mounted on the mounting table. Thereafter, the pressure inside the processing chamber is set to, e.g., about 2.66 Pa (20 mTorr) as an initial value and, e.g., about 0.93 Pa (7 mTorr) as a final value; and $O_2$ gas is supplied at a flow rate of, e.g., about 200 sccm from the gas supply unit of the shower head into the processing chamber. Then, an exciting power of 300 W and a bias power of 250 W are supplied to the mounting table.

Figure 5G:
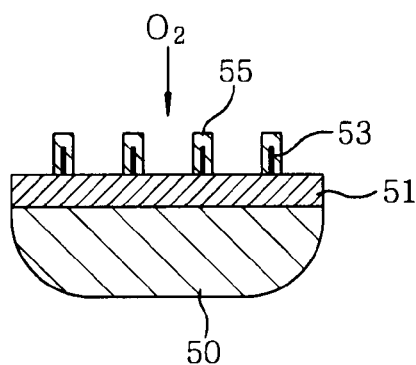
Figure 5H:
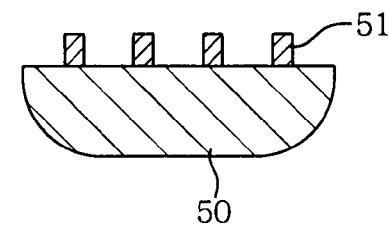

Resultantly, the $O_2$ gas is excited by the high frequency power supplied to the processing space to be converted to a plasma. As a result, ions and radicals are generated (FIG. 5G). The generated ions and radicals collide with portions of the amorphous carbon film 51 that are not covered by the line portions (silicon oxide film 55), so that the amorphous carbon film 51 is etched (FIG. 5H).

As such, it is possible to obtain a mask layer having an improved etching resistance as well as a reduced line width of a line portion thereof in accordance with the present embodiment.

Although the photoresist film is employed as the organic film in the present embodiment, the organic film that is subjected to the mineralizing treatment is not limited to the photoresist film. Alternatively, another organic film serving a mask layer may be employed. Further, the organic film is not limited to a surface layer of a target substrate, but can be an intermediate layer.

In the present embodiment, the substrate to be subjected to the plasma treatment is not limited to a wafer for semiconductor devices. For example, the substrate may be one of various kinds of a substrate, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the present embodiment and allowing a computer (or a central processing unit (CPU) or a microprocessor unit (MPU)) thereof to read and execute the program codes stored in the medium.

In this case, the program codes themselves read from the medium realize the functions of the aforementioned embodiment and the present invention includes the program codes and the medium storing the program codes.

The medium for providing the program codes may be, e.g., a floppy (registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded through networks.

The functions of the aforementioned embodiment can be realized by executing the program codes read by the computer. Alternatively, an operating system (OS) or the like operating on the computer can execute a part or the whole of the actual processing in accordance with the instructions of the program codes and the functions of the embodiment can be realized by the processing executed by the OS or the like.

In addition, the program codes can be read from a storage and inputted to a memory in a built-in function extension board or an external function extension unit of a computer and the functions of the embodiment can be realized by the processing of a CPU or the like in the extension board or the extension unit, which executes the extension function thereof according to the instructions of the program codes to perform a part or the whole of the actual processing.

While the invention has been shown and described with respect to the embodiments, it will be understood by those skilled in the art that various changes and modification may be made without departing from the scope of the invention as defined in the following claims.

What is claimed is:

1. A method of processing a substrate including a processing target layer and a patterned organic film, the method comprising:
    modifying the patterned organic film to produce a modified patterned film, wherein the modifying includes allowing a silicon-containing gas to be adsorbed onto a surface of the patterned organic film; and oxidizing adsorbed silicon to thereby produce the modified patterned film, wherein the modified patterned film includes a silicon oxide film, and wherein during at least one of the allowing and the oxidizing at least a portion of a material of the patterned organic film is removed; and
    performing a post-modification etching of the silicon oxide film to thereby produce an etched modified patterned structure,
    wherein a line width of a line portion of the patterned organic film immediately prior to modifying is greater than the line width of the line portion of the modified patterned film after the post-modification etching.

2. The method of claim 1, wherein in the allowing, a processing pressure is in the range from approximately $1.33 \times 10^{-1}$ Pa (1 mTorr) to $1.33 \times 10$ kPa (100 Torr).

3. The method of claim 1, wherein in the oxidizing, a processing temperature is in the range from approximately 20° C. to 700° C.

4. The method of claim 1, wherein the line width of the line portion of the patterned organic film immediately prior to modifying is about 30 nm.

5. The method of claim 1, wherein the etched modified patterned structure comprises a portion of the silicon oxide film and a portion of the patterned organic film.

6. The method of claim 1, wherein the material removed from the patterned organic film during the modifying comprises carbon and wherein carbon is vaporized during the oxidizing of the adsorbed silicon.

7. The method of claim 1, wherein in the oxidizing, a processing pressure is in the range from approximately $1.33 \times 10^{-1}$ Pa (1 mTorr) to $1.33 \times 10$ kPa (100 Torr).

8. The method of claim 7, wherein in the oxidizing, a processing temperature is in the range from approximately 20° C. to 700° C.

9. The method of claim 1, wherein in the oxidizing, an oxygen-containing gas is employed as an oxidizing gas, and the silicon-containing gas is oxidized by oxygen radicals produced by plasma-exciting the oxygen-containing gas.

10. The method of claim 9, wherein in the oxidizing, a processing temperature is in the range from approximately 20° C. to 700° C.

11. The method of claim 9, wherein in the oxidizing, a processing pressure is in the range from approximately $1.33 \times 10^{-1}$ Pa (1 mTorr) to $1.33 \times 10$ kPa (100 Torr).

12. The method of claim 11, wherein in the oxidizing, a processing temperature is in the range from approximately 20° C. to 700° C.

13. The method of claim 1, further comprising, performing a pre-modification etching before modifying the patterned organic film, to etch the patterned organic film such that a line width of a line portion of the patterned organic film prior to the pre-modification etching is greater than the line width of the line portion of the patterned organic film after the pre-modification etching, and further wherein the line width after the post-modification etching is smaller than the line width after the pre-modification etching.

14. The method of claim 13, wherein the target layer comprises an amorphous carbon film, and wherein the patterned organic film is positioned above the amorphous carbon film, the method further including:

after said post-modification etching, performing an amorphous carbon etching through openings defined by the etched modified patterned structure.

15. The method of claim 14, wherein prior to the amorphous carbon etching, the etched modified patterned structure comprises a portion of the silicon oxide film and a portion of the patterned organic film.

16. The method of claim 14, wherein the line width of the line portion of the patterned organic film after the pre-modification etching is equal to or less than approximately 60 nm.

17. The method of claim 1, wherein the target layer of the substrate includes an additional film, wherein during the modifying a silicon oxide film is formed on an upper surface of the additional film, and further wherein the upper surface of the additional film is exposed after said post-modification etching.

18. The method of claim 17, wherein the additional film is an amorphous carbon film.

19. The method of claim 18, further comprising, after the post-modification etching, etching the amorphous carbon film through a plurality of openings defined by the etched modified patterned structure.

20. The method of claim 19, wherein after the post-modification etching and prior to the etching of the amorphous carbon film, the etched modified patterned structure includes a portion of the silicon oxide film and a portion of the patterned organic film.

* * * * *